(12) United States Patent
Delshadpour et al.

(10) Patent No.: US 10,763,809 B2
(45) Date of Patent: Sep. 1, 2020

(54) VOLTAGE DETECTION CIRCUIT

(71) Applicant: NXP B.V., Eindhoven (NL)

(72) Inventors: Siamak Delshadpour, Phoenix, AZ (US); Ahmad Dashtestani, Gilbert, AZ (US)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 16/233,604

(22) Filed: Dec. 27, 2018

(65) Prior Publication Data
US 2020/0212860 A1 Jul. 2, 2020

(51) Int. Cl.
| | |
|---|---|
| H03G 3/00 | (2006.01) |
| H03G 1/00 | (2006.01) |
| G01R 19/00 | (2006.01) |
| H02H 9/04 | (2006.01) |
| H03K 17/12 | (2006.01) |
| H03M 1/18 | (2006.01) |

(52) U.S. Cl.
CPC ......... *H03G 3/001* (2013.01); *G01R 19/0084* (2013.01); *H02H 9/046* (2013.01); *H03G 1/0088* (2013.01); *H03K 17/122* (2013.01); *H03M 1/185* (2013.01)

(58) Field of Classification Search
CPC ...... H03G 3/001; H03G 1/0088; H02H 9/046; H03M 1/185; H03K 17/22; G01R 19/0084
See application file for complete search history.

(56) References Cited

U.S. PATENT DOCUMENTS

| | | | |
|---|---|---|---|
| 6,680,640 B1 | 1/2004 | Behzad | |
| 9,166,473 B2* | 10/2015 | Groom | ................ H02M 3/156 |
| 10,162,373 B1* | 12/2018 | Chong | ...................... G05F 1/56 |
| 2003/0215033 A1 | 11/2003 | Drapkin et al. | |
| 2008/0252378 A1 | 10/2008 | Hughes | |
| 2009/0072810 A1* | 3/2009 | Lee | .................. G01R 19/16552 |
| | | | 324/76.11 |
| 2011/0001454 A1* | 1/2011 | Kano | ........................ H02J 7/00 |
| | | | 320/107 |
| 2012/0126781 A1* | 5/2012 | Narayanan | ......... G01R 31/3004 |
| | | | 324/76.11 |
| 2013/0257391 A1* | 10/2013 | Buenz | ..................... H02M 1/42 |
| | | | 323/207 |
| 2018/0335818 A1* | 11/2018 | Mattos | .................... G06F 1/266 |

* cited by examiner

Primary Examiner — Vineeta S Panwalkar (57) ABSTRACT

A voltage detection circuit including an input voltage stage configured to scale down an input voltage to produce a scaled down voltage, a gain loss stage configured to receive and adjust the scaled down voltage based on a determined gain or loss to be applied to the scaled down voltage, and a comparison circuit configured to determine if the input voltage is over or under a desired voltage value.

19 Claims, 9 Drawing Sheets

| VBUS (V) | Opamp BASED GAIN STAGE | | Gm BASED GAIN STAGE | | Vin (V) |
|---|---|---|---|---|---|
| | Vx=VBUS/10 (V) | GAIN | Vx=VBUS/20 (V) | GAIN | |
| 0.5 ≤ VBUS < 1.5 | 0.1 | 1/.1 | 0.05 | 2/.1 | 1 |
| 1.5 ≤ VBUS < 2.5 | 0.2 | 1/.2 | 0.1 | 2/.2 | 1 |
| 2.5 ≤ VBUS < 3.5 | 0.3 | 1/.3 | 0.15 | 2/.3 | 1 |
| 3.5 ≤ VBUS < 4.5 | 0.4 | 1/.4 | 0.2 | 2/.4 | 1 |
| 4.5 ≤ VBUS < 5.5 | 0.5 | 1/.5 | 0.25 | 2/.5 | 1 |
| 5.5 ≤ VBUS < 6.5 | 0.6 | 1/.6 | 0.3 | 2/.6 | 1 |
| 6.5 ≤ VBUS < 7.5 | 0.7 | 1/.7 | 0.35 | 2/.7 | 1 |
| 7.5 ≤ VBUS < 8.5 | 0.8 | 1/.8 | 0.4 | 2/.8 | 1 |
| 8.5 ≤ VBUS < 9.5 | 0.9 | 1/.9 | 0.45 | 2/.9 | 1 |
| 9.5 ≤ VBUS < 10.5 | 1 | 1/1 | 0.5 | 2/1 | 1 |
| 10.5 ≤ VBUS < 11.5 | 1.1 | 1/1.1 | 0.55 | 2/1.1 | 1 |
| 11.5 ≤ VBUS < 12.5 | 1.2 | 1/1.2 | 0.6 | 2/1.2 | 1 |
| 12.5 ≤ VBUS < 13.5 | 1.3 | 1/1.3 | 0.65 | 2/1.3 | 1 |
| 13.5 ≤ VBUS < 14.5 | 1.4 | 1/1.4 | 0.7 | 2/1.4 | 1 |
| 14.5 ≤ VBUS < 15.5 | 1.5 | 1/1.5 | 0.75 | 2/1.5 | 1 |
| 15.5 ≤ VBUS < 16.5 | 1.6 | 1/1.6 | 0.8 | 2/1.6 | 1 |
| 16.5 ≤ VBUS < 17.5 | 1.7 | 1/1.7 | 0.85 | 2/1.7 | 1 |
| 17.5 ≤ VBUS < 18.5 | 1.8 | 1/1.8 | 0.9 | 2/1.8 | 1 |
| 18.5 ≤ VBUS < 19.5 | 1.9 | 1/1.9 | 0.95 | 2/1.9 | 1 |
| 19.5 ≤ VBUS < 20.5 | 2 | 1/2 | 1 | 2/2 | 1 |

|  | $\overline{OV}$ | $\overline{UV}$ | $\overline{OUV}$ |
|---|---|---|---|
| WHEN VrefL < Vin < VrefH | 1 | 1 | 1 |
| WHEN VrefH < Vin | 0 | 1 | 0 |
| WHEN Vin < VrefL | 1 | 0 | 0 |

FIG. 9

VOLTAGE DETECTION CIRCUIT

TECHNICAL FIELD

Example embodiments disclosed herein relate generally voltage detection circuits including an accurate, fast response, and low current VBUS over/under voltage detection circuit for Type-C Power Delivery Systems.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

Example embodiments include a voltage detection circuit including an input voltage stage configured to scale down an input voltage to produce a scaled down voltage, a gain loss stage configured to receive and adjust the scaled down voltage based on a determined gain or loss to be applied to the scaled down voltage, and a comparison circuit configured to determine if the input voltage is over or under a desired voltage value.

The input voltage section may include a resistor voltage divider.

The input voltage may be scaled down by a factor of ten.

The gain-loss section may include a parallel resistor arrangement with a switch associated with each parallel resistor. The voltage detection circuit may include a comparator circuit, wherein an output of the parallel resistor arrangement is input to the comparator.

The gain-loss section outputs a voltage of about 1V.

The comparator section may include a high reference circuit and a low reference circuit.

The gain-loss section may use a reciprocal of the scaled down voltage to determine an output of the gain-loss section.

The gain loss stage may be operational amplifier (opamp) based.

The gain loss stage may be transconductane (gm) based.
The input voltage may be scaled down by a factor of twenty.

Example embodiments may also include a method of detecting a voltage including inputting an input voltage, scaling down the input voltage, adjusting the scaled down voltage using a parallel arrangement of resistors and inputting the adjusted voltage to a first comparator, outputting an output voltage from the comparator, and using the output voltage in a comparison circuit to determine if the input voltage is within a desired range.

The method may include outputting an output voltage of about 1V.

Adjusting the scaled down voltage may use an opamp based gain loss stage.

Adjusting the scaled down voltage may use a gm based gain loss stage. The method may include scaling down the input voltage by a factor of twenty.

The method may include scaling down the input voltage by a factor of ten.

The method may include using a high reference circuit and a low reference circuit in the comparison circuit.

The method may include using a reciprocal of the scaled down voltage to determine an output of the gain-loss section.

BRIEF DESCRIPTION OF THE DRAWINGS

Additional objects and features of the invention will be more readily apparent from the following detailed description and appended claims when taken in conjunction with the drawings.

Although several example embodiments are illustrated and described, like reference numerals identify like parts in each of the figures, in which.

DETAILED DESCRIPTION

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

A VBUS Voltage in a universal serial bus (USB) power delivery (PD) system may be a source of power. A system may be in either a sink or source mode. In both modes, VBUS can be in a range of 5 to 20 V. Functionality of a circuit may support a higher range, e.g., 25V. The system may sense a negotiated or expected VBUS voltage, and determine if VBUS is within the negotiated or expected range. For ease of description, it may be assumed that 1≤VBUS≤20. Other ranges may be covered by shifting or scaling the method. Voltage detection circuitry in accordance with example embodiments may have fair accuracy, low quiescent current, small die area, and fast response.

Example embodiments include various designs and methods that may be used for over/under voltage detection purposes.

Figure 1A:
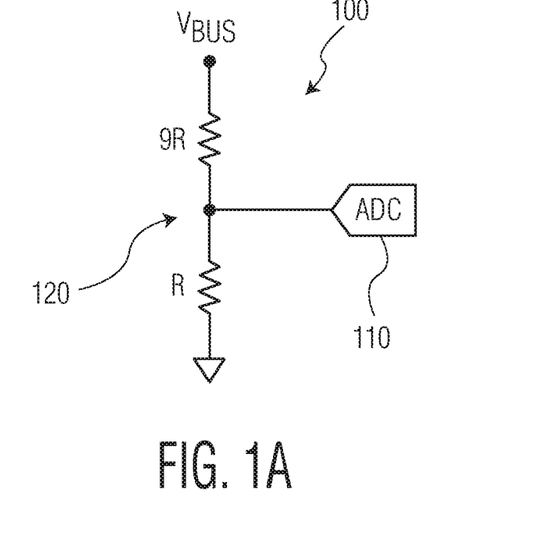
FIG. 1A illustrates an over/under voltage detection circuit using an analog to digital converter (ADC) circuit according to current designs.

FIG. 1A illustrates an over/under voltage detection circuit 100 using an analog to digital converter (ADC) circuit 110 according to current designs. The voltage detection circuit 100 may include a resistor voltage divider 120 and a five-bit ADC 110. As illustrated with the R and 9R resistor ratios, a VBUS voltage may be scaled down by a factor of ten before entering the ADC 110. However, using the ADC 110 for over/under voltage detection may be expensive and have other issues such as increased complexity, high power, and larger area. Using an ADC is one method, but drawbacks include. The ADC itself may be treated as an independent block that brings higher design complexity (and kind of over design for O/U voltage detection).

Figure 1B:
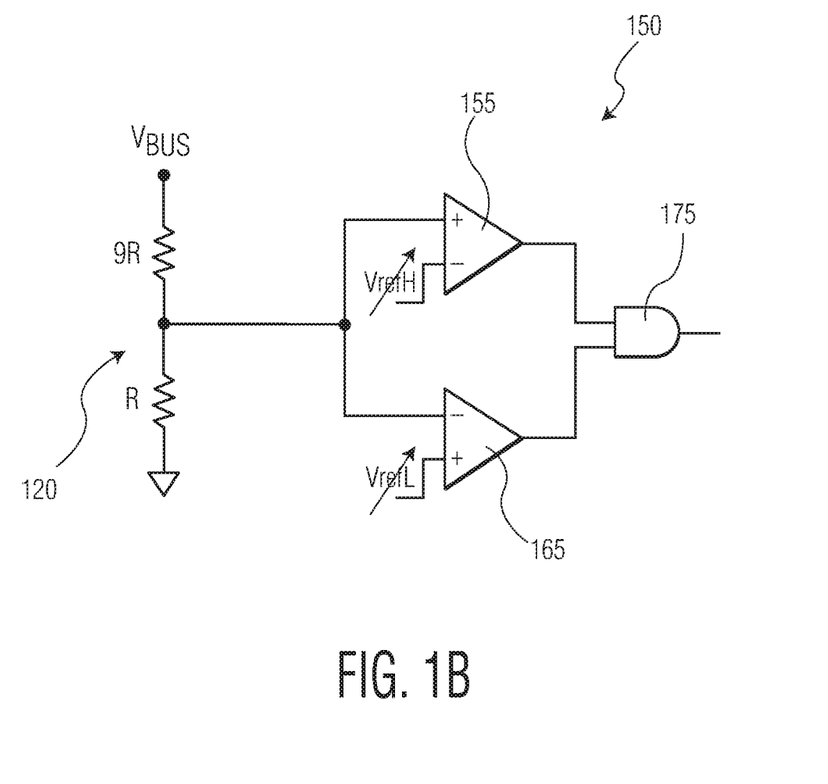
FIG. 1B illustrates another over/under voltage detection circuit in accordance with current designs.

FIG. 1B illustrates another over/under voltage detection circuit 150 in accordance with current designs. The voltage detection circuit 150 may include the resistor voltage divider 120, a plurality of comparators 155 and 165, and an AND gate 175. Use of the voltage detection circuit 150 and a second method associated therewith divides down VBUS using the resistor voltage divider 120 and sweeps two reference ranges (VrefH & VrefL) over a wide range of voltages through the first comparator 155 and the second comparator 165. An overvoltage detected from the first comparator 155 or an undervoltage detected from the second comparator 165 may send a high signal to the AND gate, triggering a desired voltage detection. However, using a sweeping reference method may suffer from low accuracy for higher VBUS values, which may translate to lower accuracy for higher Vref values.

Figure 2A:
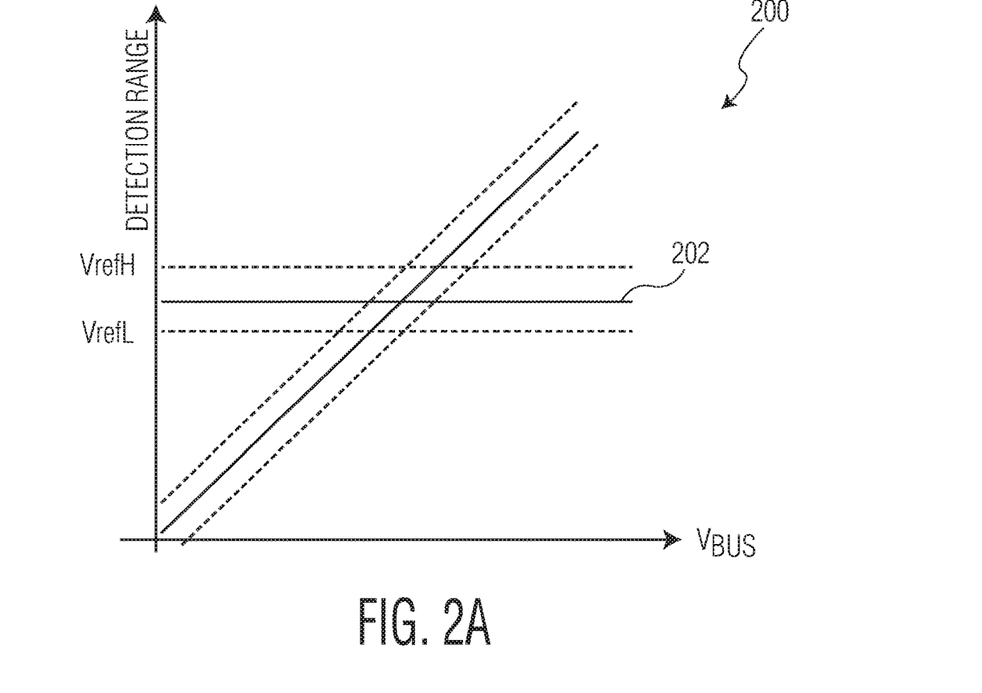
FIG. 2A illustrates a VBUS and the detected range between VrefH and VrefL in accordance with example embodiments described herein.

FIG. 2A illustrates a VBUS and the detected range graph 200 between VrefH and VrefL in accordance with example embodiments described herein. A VBUS voltage level 202 may have an initial range of between one and twenty volts. To detect whether the VBUS voltage level 202 is within a desired range or outside of the desired range, the upper limit VrefH and the lower limit VrefL may be used for comparison with the VBUS voltage level 202.

Figure 2B:
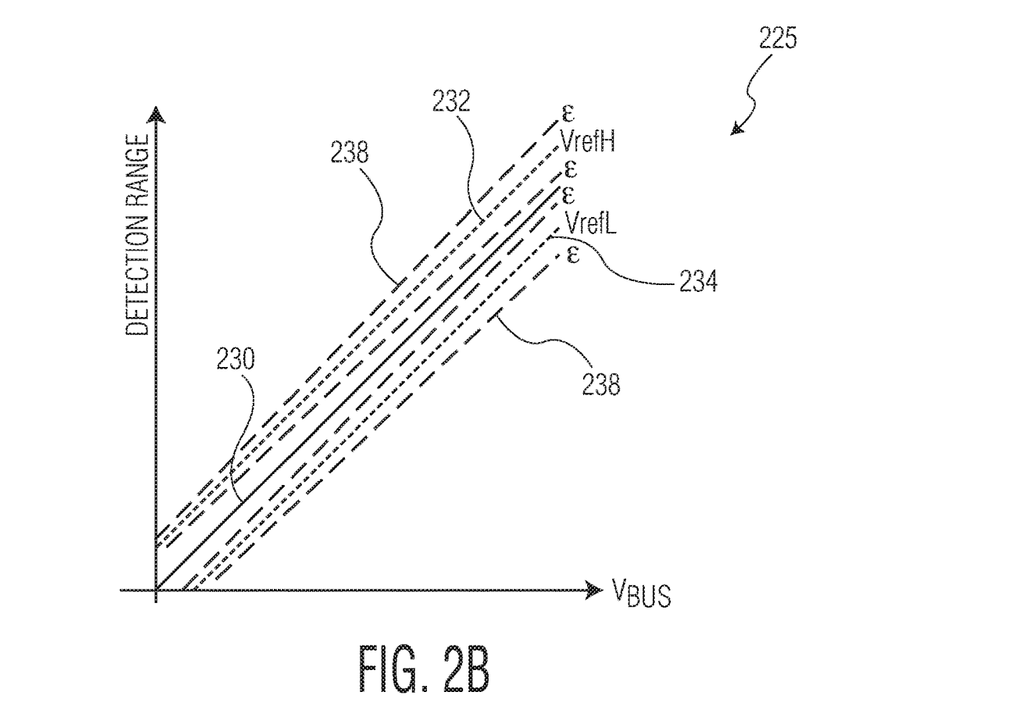
FIG. 2B illustrates an error in detection range in accordance with example embodiments described herein.

FIG. 2B illustrates a detection range error graph 225 in accordance with example embodiments described herein. The unbroken line 230 represents VBUS. The small dotted lines 232 and 234 illustrate an ideal detection range VrefH and VrefL for the VBUS voltage 230.

The longer dotted lines 238 represent absolute errors, E, that may increase for higher value of VBUS detection and be smaller for lower values. As illustrated, the absolute error lines 238 taper more towards each other towards a smaller voltage detection range than a larger one. Example embodiments have determined that VBUS detection accuracy is greater when using lower voltage detection ranges than higher detection ranges.

Mathematically, if VrefH and VrefL are moved up and down for different VBUS values (as illustrated in FIG. 1B), then VrefH−VrefL=2Δ plus the error. Example embodiments assume that VBUS may be detected within a range of (VrefH, VrefL)=+/−Δ with error of +/−ε. Such a relationship is illustrated in FIG. 2C, in a form of ε1<ε2<ε3<ε4 for VBUS1<VBUS2<VBUS3<VBUS4 values.

Figure 2C:
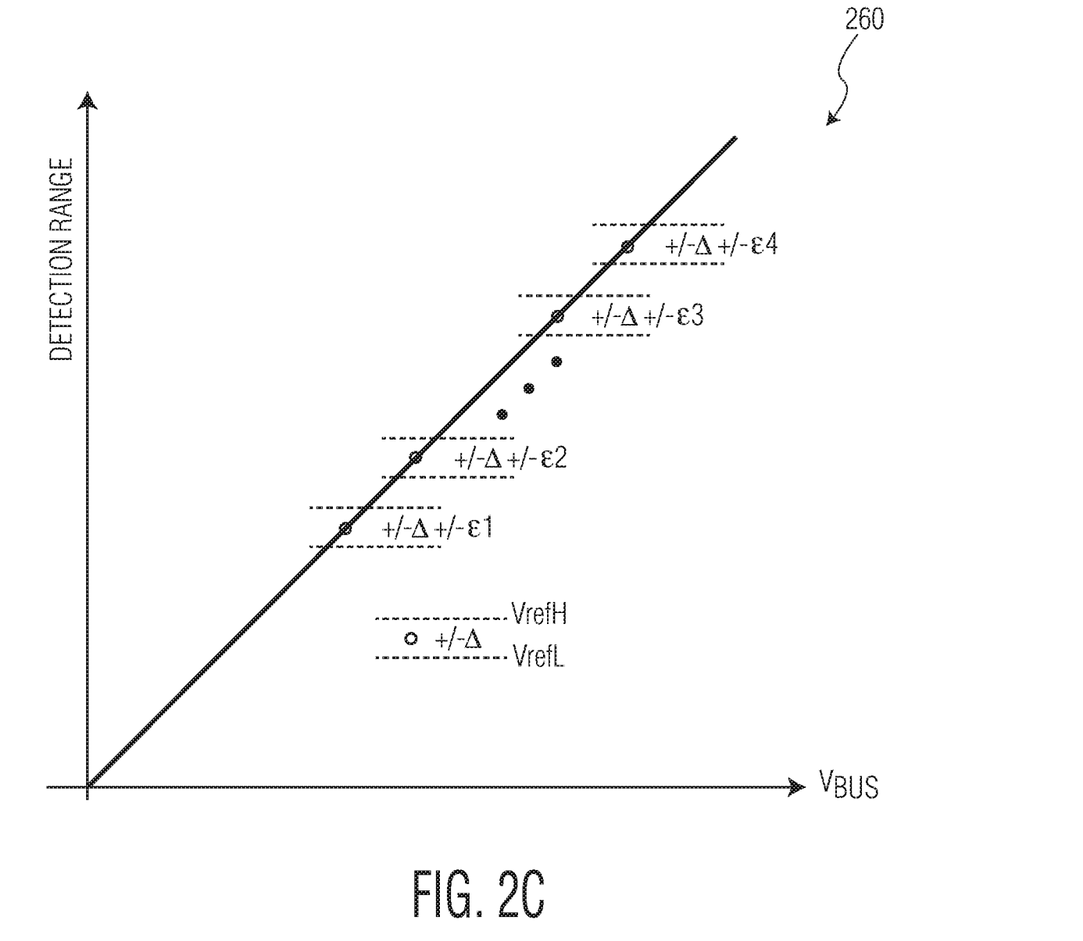
FIG. 2C illustrates a detection error increase for higher VBUS in accordance with example embodiments described herein.

FIG. 2C illustrates a detection error increase graph 260 for higher VBUS in accordance with example embodiments described herein. Example embodiments may use a middle point 265 as a center where an error will be balanced between lower and higher VBUS values.

Figure 3:
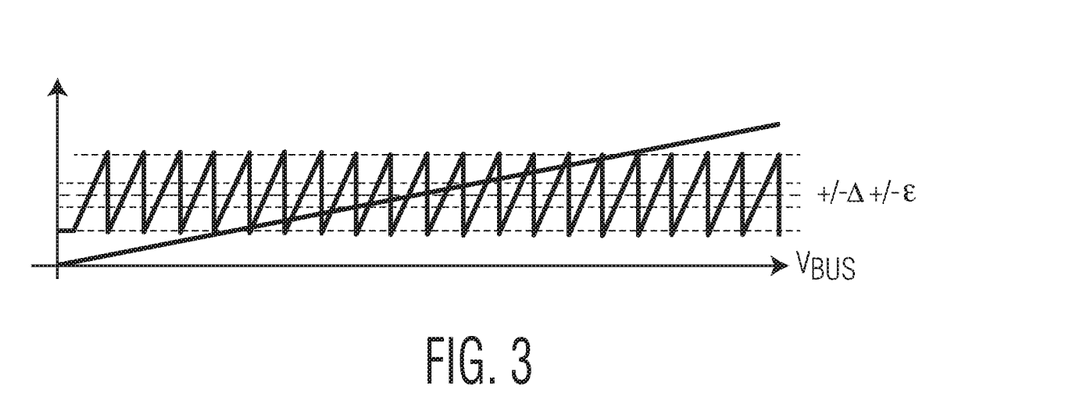
FIG. 3 illustrates a VBUS range in accordance with example embodiments described herein.

FIG. 3 illustrates a VBUS range in accordance with example embodiments described herein. As illustrated and described herein, lowering VBUS to 1V+/−0.5V range may be performed using divider, gain, and loss stages for a value of a negotiated or expected VBUS. The detection range may be a fixed range of (VrefH, VrefL)=+/−Δ with a fixed error of +/−ε.

Figure 4:
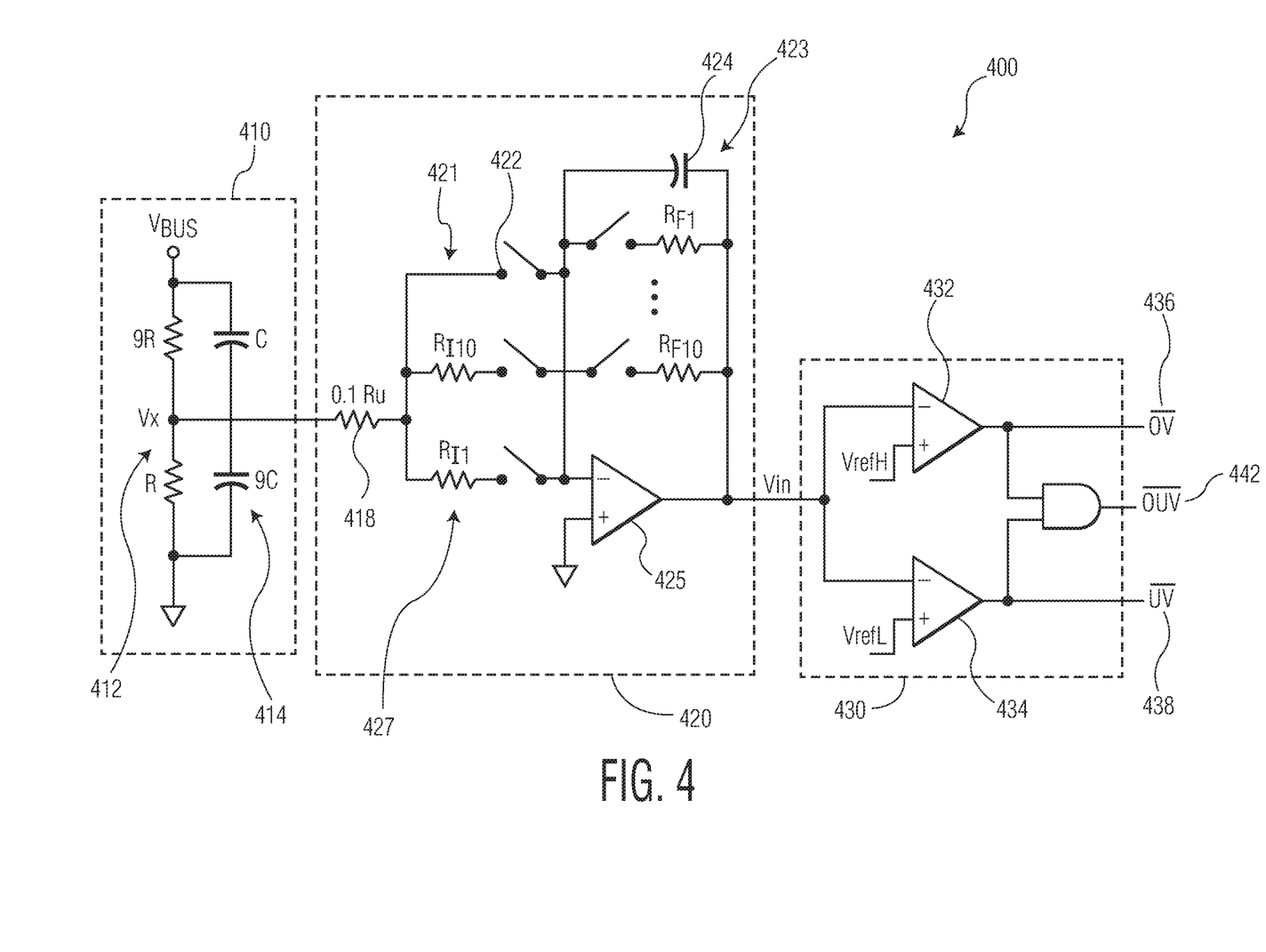
FIG. 4 illustrates an over-under voltage detection circuit having op-amp based gain and loss stages in accordance with example embodiments described herein.

FIG. 4 illustrates an over-under voltage detection circuit 400 having op-amp based gain and loss stages in accordance with example embodiments described herein. The over-under voltage detection circuit 400 may use low current and have minimal complexity. Alternatively, a power source may include an AC-DC adaptor voltage of a laptop or tablet in a 20 V range. Example embodiments describe a circuit configured for over/under (O/U) voltage detection of VBUS lines in a USB Power Delivery (PD) system or the like. Example embodiments may be implemented without using high voltage devices. An overall accuracy may be close to an offset of comparator elements after trimming, such as on an order of 1%.

The over-under voltage detection circuit 400 may receive a voltage input through a VBUS input stage 410. The VBUS input stage 410 may include a series resistor voltage divider 412 configured to bring the voltage VBUS down by a factor of ten. The resistor voltage divider 412 may have a first resistor (9R) having nine times a resistor value as a second resistor (R). This voltage divider relationship results in a one-tenth scaled down voltage value Vx as compared to VBUS. For example, if VBUS is between 4.5V and 5.5V, a value of Vx will be on the order of 0.5V. If VBUS is between 14.5V and 15.5V, a value of Vx will be 1.5. Ratio tables for Vx values in correspondence with VBUS values are illustrated in tables 810 and 820 of FIG. 8. As illustrated in table 820, a Vx value is rounded up or down to the integer between the VBUS values, then divided by a factor of ten. For example if VBUS has a value of between 9.5V and 10.5V, such as 9.8V, the voltage would be divided by ten to result in 0.98V, and rounded up to 1V.

The VBUS input stage 410 may include a capacitor voltage divider 414 in parallel with the resistor voltage divider 412. The capacitor voltage divider 414 may be added to track fast VBUS changes while the resistor voltage divider 412 may track slow changes. The capacitor voltage divider 414 may use a single capacitor for the upper capacitor and a value of nine times for the second capacitor. Each resistor voltage divider 412 and capacitor voltage divider 414 may see a maximum of VBUS/10.

The over-under voltage detection circuit 400 may include an opamp based gain loss stage 420 that may be configured to provide a loss gain ratio in a range of 0.1 to 10. Resistor values may be equal such that RIj=RFj=Ru, where j=1, 2, 3, ... 10. As illustrated, the opamp based gain loss stage 420 may receive the input voltage Vx at a first resistor 418. Current may be routed through a parallel arrangements 421 and 423 including a plurality of RI and RF values depending on activation of illustrated switches. Depending on the value of Vx, the opamp based gain loss stage 420 may multiply or divide the input voltage by a particular gain to bring the Vx value to a value of Vin. Vin is output from the opamp based gain loss stage 420 and input to a comparison circuit 430.

The opamp based gain loss stage 420 may include an input resistor having a value of 0.1 Ru. The 0.1 Ru may be connected to a first parallel arrangement 421. The first parallel arrangement 421 may include a first plurality of resistors RI1 to RI10 in parallel with a switch 422. The values of the RI1 through RI10 may be equal, and equal to a value of Ru. The RI1 to RI10 resistors may be connected to the inverted terminal of an operational amplifier (opamp) 425 and to a second parallel arrangement 423. The second parallel arrangement 423 may include a second plurality of resistors RF1 to RF10 in parallel. Resistors RF1 to RF10 may be in parallel with a capacitor 424 and connected between the inverting input of the opamp 425 and Vin, an output of the opamp 425. The values of RF1 to RF10 may also be equal, and equal to the value of Ru. The first parallel arrangement 421 may be connected to the second parallel arrangement 423 through a plurality of switches 427.

Figure 8:
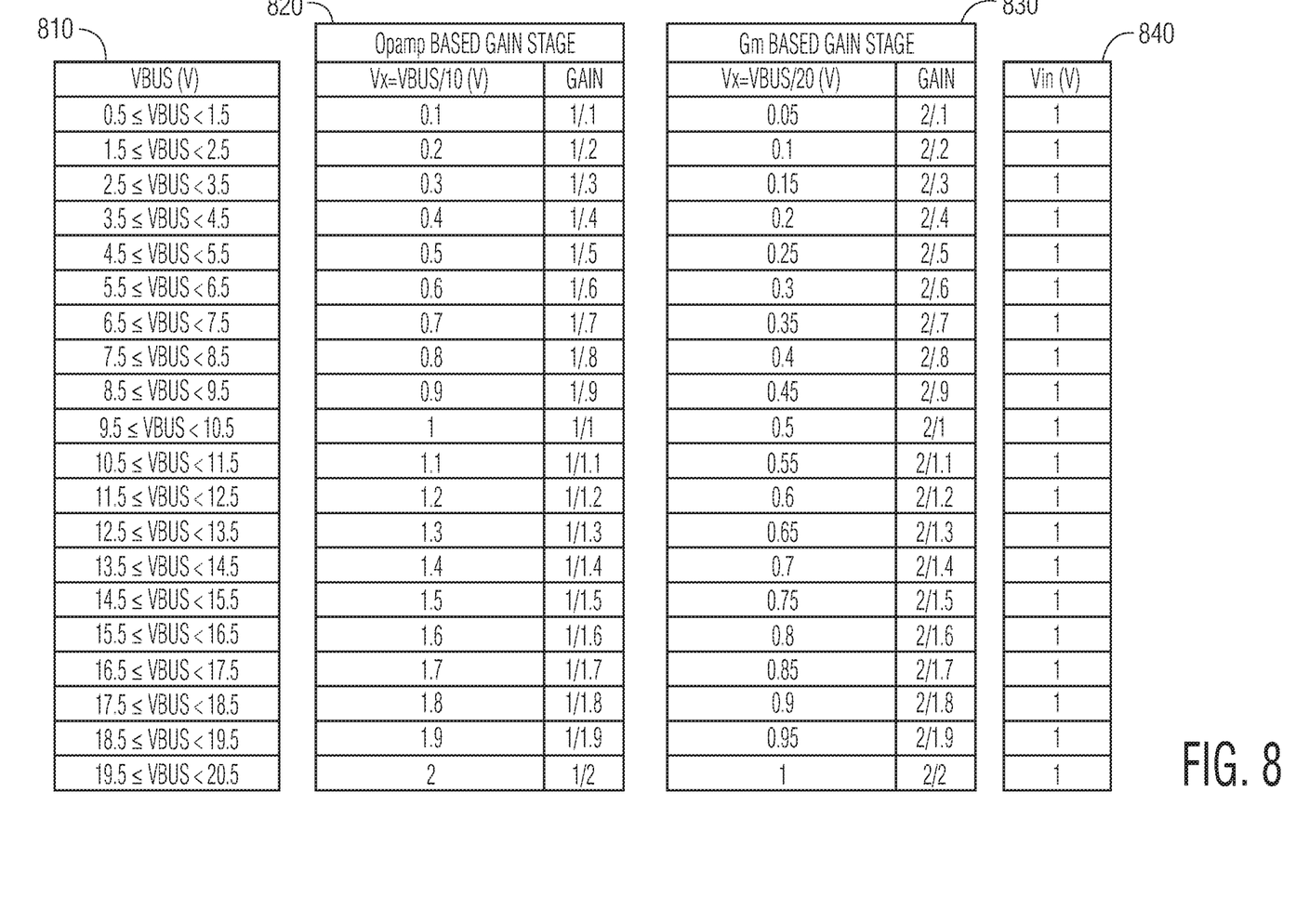
FIG. 8 illustrates a table of Gain/Loss numbers for an Opamp based gain stage and a Gm based gain stage in accordance with example embodiments described herein.

Referring to FIG. 8, the opamp based gain stage table 820 illustrates the gain values to be used to determine Vin from Vx. For example, if Vx is 0.3V, a gain of 1/0.3 will be selected and used to raise Vx to a level of Vin. The gain of 1/0.3 is a reciprocal of Vx being 0.3V. As illustrated in the Vin column 840 of FIG. 8, Vin is desired to be on the order of 1V. To arrive at Vin, the resistor values RI and RF are switched in and out of the parallel arrangements 421 and 423, and the 0.3V Vx is brought up to a value approximately 1V. A modified Vx in input to an inverting input of the opamp 425. Similarly, if Vx is higher than 1V, such as 1.6V, a gain used is actually a loss, and a multiplier for the parallel resistive network will be 1/1.6, bringing the value down to substantially 1V, Vin.

Mathematically, the opamp based gain loss stage 420 may provide gain steps as illustrated in column 810 of FIG. 8. Column 810 illustrates the relationship, for 10.5≤VBUS≤20.5, where RI=0.1 Ru+Ru/N=Ru(1+0.1 N)/N, where RF=R/N. As a result, Equation (1) may be, Gain=RF/RI=1/(1+0.1 N), where N=1, ... ,10  (1)

Equation (1) may provide gains for VBUS=11 to 20V as shown in the ten lower rows of column 810 of FIG. 8. The opamp based gain loss stage 420 may also provide for 0.5≤VBUS≤10.5:RI=0.1 Ru and RF=Ru/N. As a result, Equation (2) may be, Gain=RF/RI=10/N=1/(0.1 N), where N=1, ... ,10  (2)

Equation 2 may provide gains for VBUS=1 to 10 as shown in the ten upper rows of column 810 of FIG. 8. An equal resistor bank includes best matching for different gain settings. An encoder (not illustrated) may control switches for proper gain selection.

Referring to FIG. 2B, a worst case error, ε may come from:

ε=sqrt{Δ1^2+Δ2^2+Δ3^2+Δ4^2+Δ5^2+Δ6^2+Δ7^2}, where Δ1=a mismatch of resistors/capacitors during 1/10 divide down. Δ2=Gain mismatch (×0.5 to 10) (or ×1 to 20 in gm based implementation of Gain stage). Δ3=Offset of gain stage when Gain=10 (or 20 in gm based implementation of Gain stage). Δ4=VrefH shift. Δ5=VrefL shift. Δ6=VrefH Comparator offset. Δ7=VrefL Comparator offset All of the delta Δ(i=1,2,3,4,5,6) may be absorbed in a "one time trim" of VrefH or VrefL, except Δ7. Trimming any of VrefH (or VrefL which will replace Δ7 with Δ6) may compensate all mismatch and offsets except offsets of one comparator. In one case, |VrefH−VrefL| may have a random offset of ~sqrt (Δ7^2+Δ6^2)~1.4 Δ where Δ is an offset of one comparator.

Example embodiments may scale a VBUS voltage down to low voltages including safe working ranges and may use a gain/loss system which is configured to scale down or up VBUS to bring it to a fixed range and be compared with two fixed reference levels. As described herein, the opamp based gain loss stage 420 may use a reciprocal of the scaled down voltage to determine an output of the opamp based gain loss stage 420.

As illustrated in FIG. 4, a comparison circuit 430 and method may negotiate a voltage to be selected and two threshold ranges VrefH and VrefL may be used about a negotiated voltage. The comparison circuit 430 may determine whether Vin is between VrefH and VrefL. If Vin is not between VrefH and VrefL, then either an over or under voltage is detected. The comparison circuit 430 may include a first comparator 432 and a second comparator 434. The Vin voltage level may be routed to an inverting input of the first comparator 432 and a non-inverting input of the second comparator 434. The two comparators 432 and 434 are configured to determine if VBUS is within an expected range of VrefH and VrefL. VrefH and VrefL may be determined from an expected value of VBUS.

Figure 9:
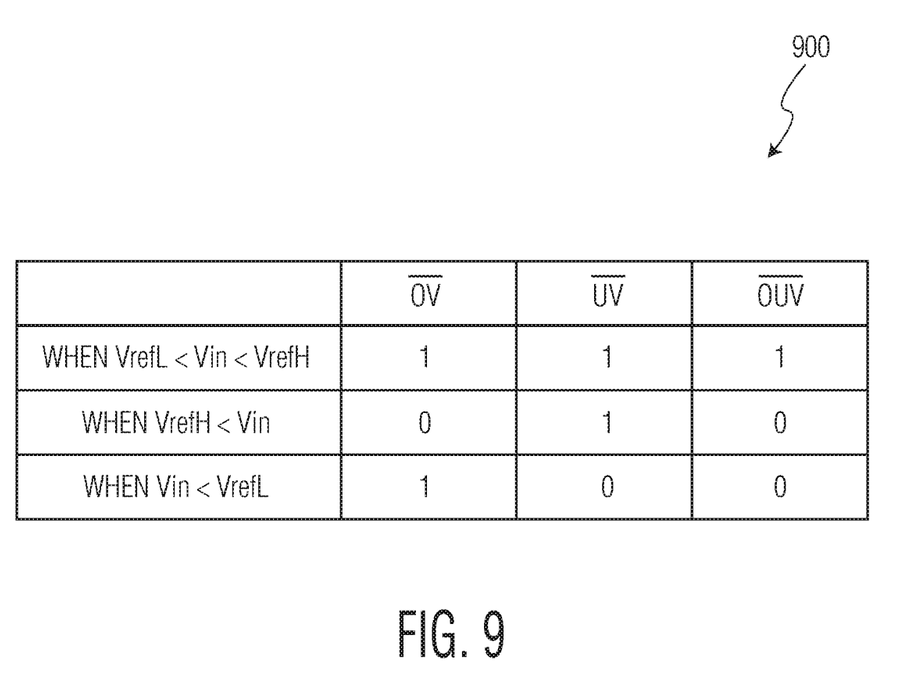
FIG. 9 illustrates a truth table configured to demonstrate outputs of the comparison circuit in accordance with example embodiments described herein.

FIG. 9 illustrates a truth table 900 configured to demonstrate outputs of the comparison circuit 430 in accordance with example embodiments described herein. Outputs of the comparison circuit 430 include not overvoltage $\overline{OV}$ signal 436, not undervoltage $\overline{UV}$ signal 438, and not under or over voltage $\overline{OUV}$ signal 442. The truth table 900 indicates that when Vin is higher than an expected range between VrefH and VrefL, $\overline{OV}$=0, or equally OV=1. Also, $\overline{OUV}$=0, or equally OUV=1. When Vin is lower than the expected range between VrefH and VrefL, $\overline{UV}$=0, or equally UV=1. Also, $\overline{OUV}$=0 or equally OUV=1. When a voltage Vin is in the expected range between VrefH and VrefL, then $\overline{OV}=\overline{UV}=\overline{OUV}$=1, or equally OV=UV=OUV=0.

Figure 5:
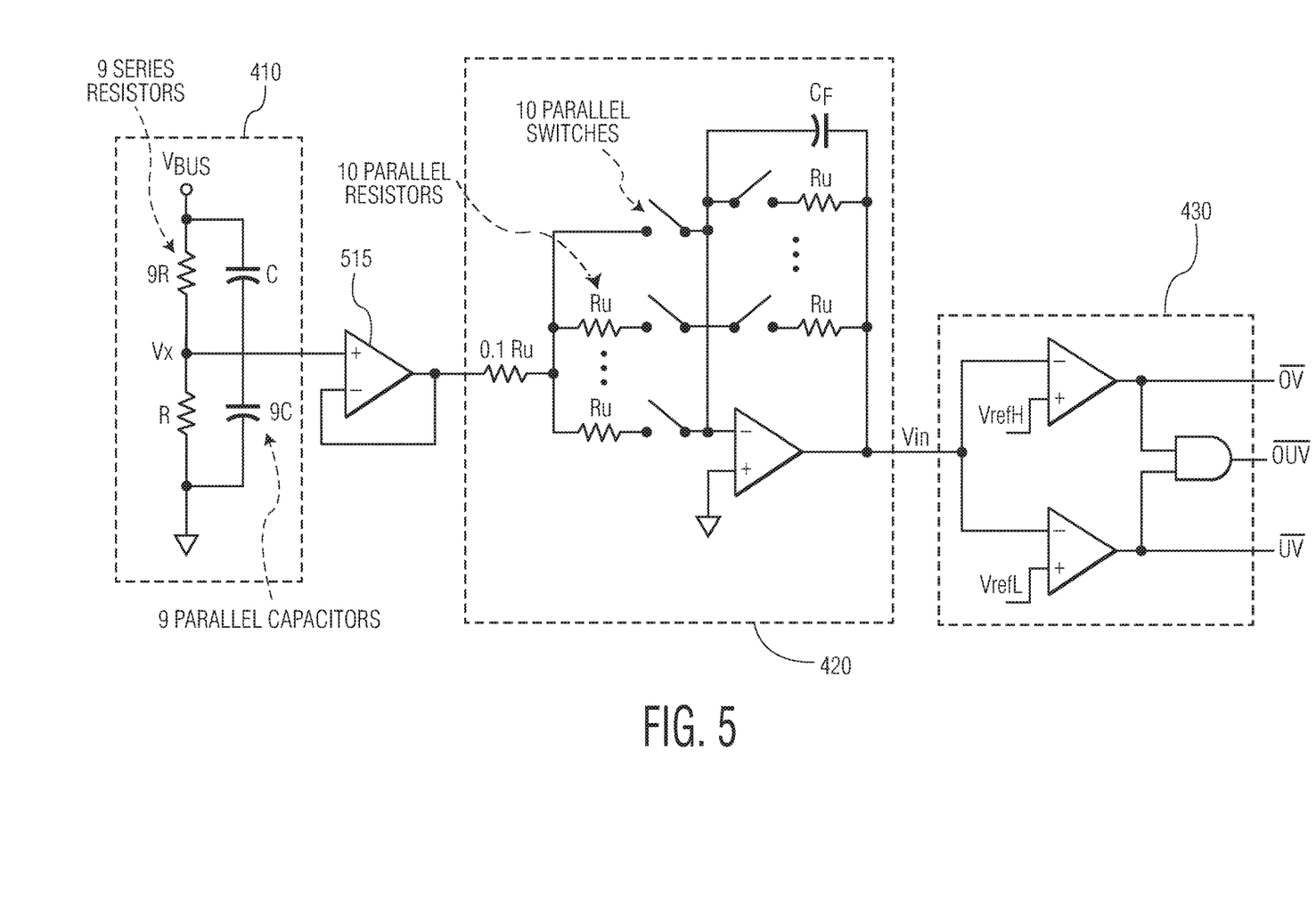
FIG. 5 illustrates an over/under voltage detection circuit with an opamp based gain/loss stage with all of the resistors having the same value in accordance with example embodiments described herein.
Figure 6:
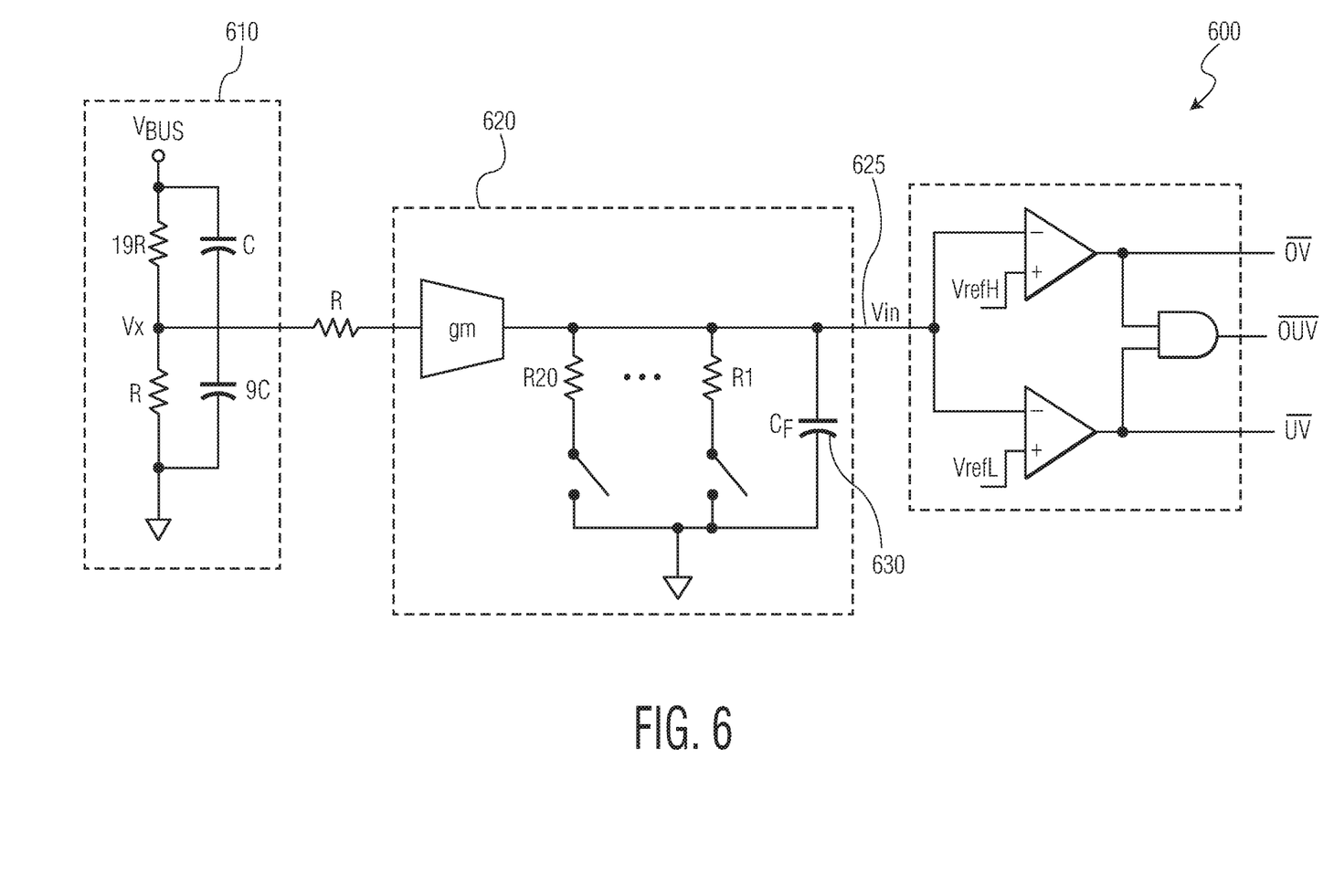
FIG. 6 illustrates an over/under voltage detection circuit with Gm*R implementation of a gain stage in accordance with example embodiments described herein.

FIGS. 5 and 6 illustrate a use of low accuracy comparators and op-amps while obtaining high accuracy gain steps for a specified application. FIG. 5 illustrates an over/under voltage detection circuit with an Opamp based Gain/loss stage with all of the resistors having a same value. FIG. 5 illustrates the circuit of FIG. 4 with a buffer 515 disposed between the VBUS input stage 410 and the opamp based gain loss stage 420. The way the resistor bank is implemented within the opamp based gain loss stage 420 may provide significant gain matching and may provide the gain expressed in equations (1) and (2).

In FIG. 6, a capacitor 630 may be used to provide low pass filtering and remove high frequency noise of VBUS. For "only VD or UVD detection," the comparator may have a high offset (meaning very small size). The offset will be compensated by trimming the resistor 710.

According to example embodiments, Vin 625, an output of a gm based gain loss stage 620 may have a DC common mode voltage, may be made by circuit techniques, resulting in Vin=0.5+Gain*Vbus/10 (in which the gain value is already demonstrated in equations 1 and 2). The conceptual schematic is not showing that. The DC adjustment can be compensated by shifting reference voltages.

FIG. 6 illustrates an over/under voltage detection circuit with Gm*R implementation of a gain stage in accordance with example embodiments described herein. FIG. 6 illustrates a Gm*R Implementation of in the gm based gain loss stage 620. In the gm based gain loss stage 620, the resistors Rn=Ru, (n=1, 2, . . . , 20).

FIG. 6 illustrates the gm based implementation circuit 600 of the gm based gain loss stage 620. All resistors may have an equal value, that means gain=gm*Ru/N. The gm based implementation circuit 600 may receive a voltage input through a VBUS input stage 610. The VBUS input stage 610 may include a resistor voltage divider 612 configured to bring the voltage VBUS down by a factor of 1/20. The resistor voltage divider 612 may have an upper resistor having nineteen times a resistor value as a lower second resistor. The VBUS input stage 410 may also have a capacitor voltage divider 414 in a similar manner to that illustrated in FIG. 4.

A well-matched gm based gain loss stage 620 combined with low current architecture make example embodiments a good choice for VBUS detection without using high voltage devices. Final accuracy may be less than an offset of two comparators after trimming and almost fixed for all VBUS values.

Figure 7:
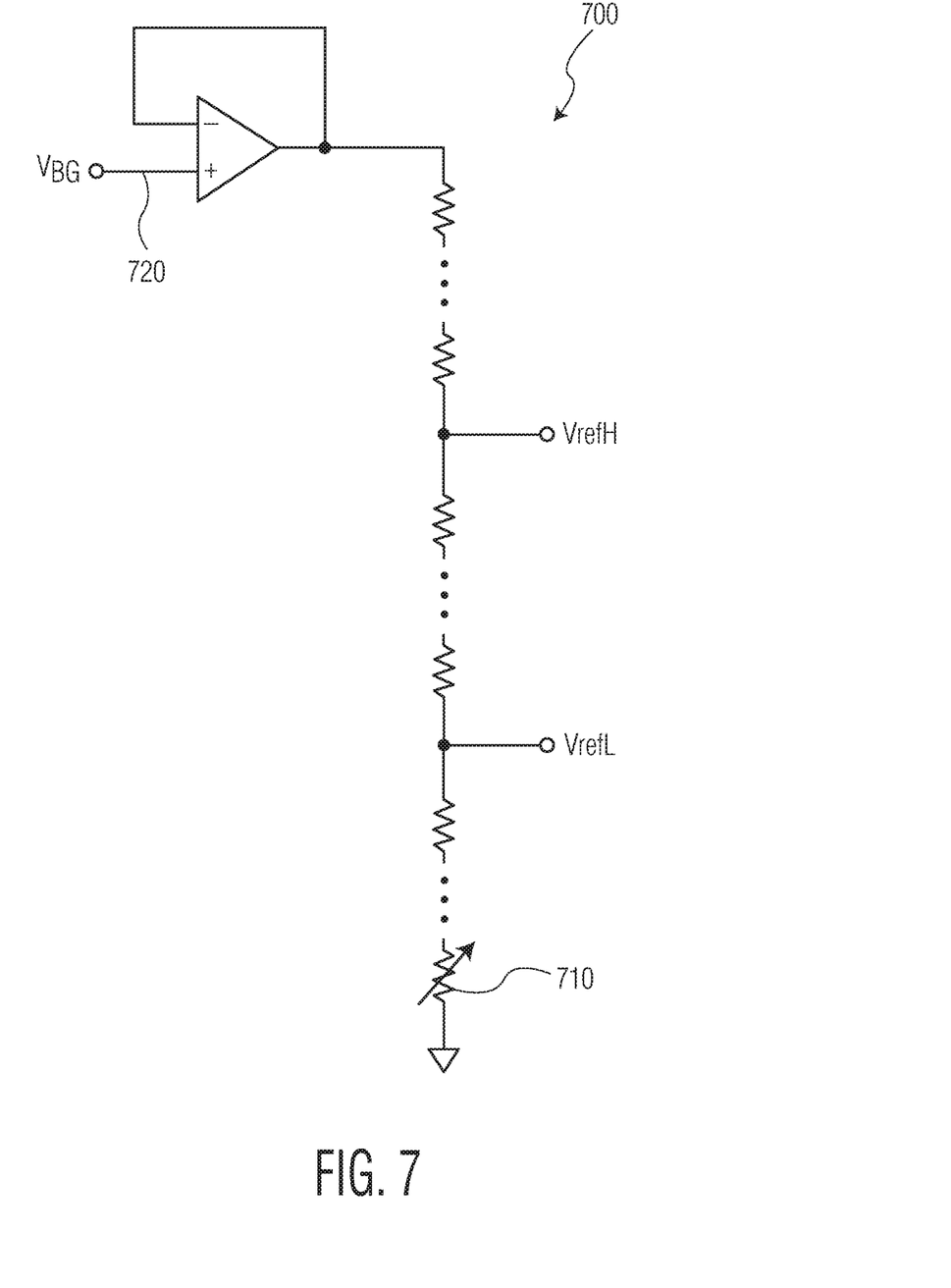
FIG. 7 illustrates a reference generator/select with RT, trimmable resistor to trim VrefH and Vref in accordance with example embodiments described herein.

FIG. 7 illustrates a VrefH and VrefL generator circuit 700 with a resistor 710 configured for trimming. According to example embodiments, designing "low offset" comparators may reduce this error. In accordance with example embodiments, the trimming resistor 710 may be selected as a weighted resistor configured to compensate for process variations if trimming is used to achieve better accuracy. A band gap voltage 720 being used as a main reference may not be trimmed. If only OVD or UVD detection is needed, trimming may be done with respect to VrefH or VrefL to provide an accurate output. An offset of the opamp 425 may also be compensated during trimming.

FIG. 8 illustrates a plurality of table columns representing of gain and loss data for the opamp based gain stage 420 and a gm based gain loss stage 620. Table 810 illustrates 1 volt voltage ranges for input voltages such as Vbus starting at 0.5 to 1.5 up to 19.5 to 20.5. Table 840 illustrates an assumed input voltage to the comparators Vin as being 1 V. Table 820 illustrates the gain required to achieve a Vin of 1V for the Opamp based gain stage 420 for the various VBUS values. Table 830 illustrates the gain required to achieve a Vin of 1V for the Gm based gain stage for the various VBUS values.

Example embodiments may detect a range of negotiated VBUS Voltage in Type-C PD (up to about 25V) using low voltage devices with high accuracy and fast response.

Example embodiments exhibit several characteristics including a low current-high accuracy combination including fast O/U voltage Detection, low complexity, no requirement for a clock, and a high accuracy for small or large VBUS values. Example embodiments may use low current opamp and comparators. Example embodiments may include small trims for accuracy.

Although the various example embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A voltage detection circuit, comprising:
an input voltage circuit configured to scale down an input voltage to produce a scaled down voltage;
a gain loss circuit configured to receive and adjust the scaled down voltage based on a determined gain or loss to be applied to the scaled down voltage; and
a comparison circuit configured to determine if the input voltage is over or under a desired voltage value;
wherein the gain-loss circuit includes a parallel resistor arrangement with a switch associated with each parallel resistor.

2. The voltage detection circuit of claim 1, wherein the input voltage circuit includes a resistor voltage divider.

3. The voltage detection circuit of claim 1, wherein the input voltage is scaled down by a factor of ten.

4. The voltage detection circuit of clam 1, comprising a comparator circuit, wherein an output of the parallel resistor arrangement is input to the comparator.

5. The voltage detection circuit of claim 1, wherein the gain-loss circuit outputs a voltage of about 1V.

6. The voltage detection circuit of claim 1, wherein the comparison circuit includes a high reference circuit and a low reference circuit.

7. The voltage detection circuit of claim 1, wherein the gain-loss circuit uses a reciprocal of the scaled down voltage to determine an output of the gain-loss circuit.

8. The voltage detection circuit of claim 1, wherein the gain loss circuit is operational amplifier (opamp) based.

9. The voltage detection circuit of claim 1, wherein the gain loss circuit is transconductance (gm) based.

10. The voltage detection circuit of claim 9, wherein the input voltage is scaled down by a factor of twenty.

11. A method of detecting a voltage, comprising:
inputting an input voltage;
scaling down the input voltage;
adjusting the scaled down voltage using a parallel arrangement of resistors and inputting the adjusted voltage to a first comparator;
outputting an output voltage from the comparator; and
using the output voltage in a comparison circuit to determine if the input voltage is within a desired range.

12. The method of claim 11, comprising outputting an output voltage of about 1V.

13. The method of claim 11, wherein adjusting the scaled down voltage uses an operational amplifier (opamp) based gain loss stage.

14. The method of claim 11, wherein adjusting the scaled down voltage uses a transconductance (gm) based gain loss stage.

15. The method of claim 14, comprising scaling down the input voltage by a factor of twenty.

16. The method of claim 11, comprising scaling down the input voltage by a factor of ten.

17. The method of claim 11, comprising using a high reference circuit and a low reference circuit in the comparison circuit.

18. The method of claim 11, comprising using a reciprocal of the scaled down voltage to determine an output of the gain-loss section.

19. A voltage detection circuit, comprising:
an input voltage circuit configured to scale down an input voltage to produce a scaled down voltage;

a gain loss circuit configured to receive and adjust the scaled down voltage based on a determined gain or loss to be applied to the scaled down voltage; and a comparison circuit configured to determine if the input voltage is over or under a desired voltage value;

wherein the gain-loss circuit uses a reciprocal of the scaled down voltage to determine an output of the gain-loss circuit.

\* \* \* \* \*